United States Patent [19]
Sorensen et al.

[11] Patent Number: 5,815,047
[45] Date of Patent: Sep. 29, 1998

[54] FAST TRANSITION RF IMPEDANCE MATCHING NETWORK FOR PLASMA REACTOR IGNITION

[75] Inventors: Carl A. Sorensen, Morgan Hill; Wendell T. Blonigan, Fremont; John White, Hayward, all of Calif.

[73] Assignee: Applied Materials, Inc., Santa Clara, Calif.

[21] Appl. No.: 563,849

[22] Filed: Nov. 27, 1995

Related U.S. Application Data

[63] Continuation of Ser. No. 145,992, Oct. 29, 1993, abandoned.

[51] Int. Cl.[6] ........................................ H03H 7/40
[52] U.S. Cl. ................. 333/17.3; 333/32; 333/99 PL; 315/111.21
[58] Field of Search ................ 333/17.3, 32, 99 PL; 315/111.21

[56] References Cited

U.S. PATENT DOCUMENTS

| | | | |
|---|---|---|---|
| 3,436,333 | 4/1969 | Beaudry | 333/32 X |
| 4,375,051 | 2/1983 | Theall | 333/17.3 |
| 4,629,940 | 12/1986 | Gagne et al. | 333/32 X |
| 4,679,007 | 7/1987 | Reese et al. | 333/17.1 |
| 5,053,725 | 10/1991 | Gesche et al. | 333/17.3 |
| 5,288,971 | 2/1994 | Knipp | 315/111.21 X |

*Primary Examiner*—Benny Lee
*Attorney, Agent, or Firm*—Fish & Richardson, P.C.

[57] ABSTRACT

An impedance matching network for an RF coupled plasma reactor having RF excitation apparatus receiving RF power through the impedance matching network from an RF generator for producing a plasma in the reactor has at least one capacitor connected to the output of the RF generator and having a capacitance value providing an impedance match to the plasma impedance during a steady state of the plasma, at least a first rapidly tunable capacitor connected in parallel with the one capacitor, the rapidly tunable capacitor being rapidly switchable between a high capacitance value providing a match to the plasma impedance during the onset of plasma ignition and a lesser minimum capacitance value, and a controller for rapidly switching the rapidly tunable capacitor from the high to the lesser capacitance value upon reaching the plasma steady state.

29 Claims, 3 Drawing Sheets

FAST TRANSITION RF IMPEDANCE MATCHING NETWORK FOR PLASMA REACTOR IGNITION

CROSS REFERENCE TO RELATED APPLICATIONS

This application is a continuation of U.S. patent application Ser. No. 08/145,992, entitled "FAST TRANSITION RF NETWORK FOR PLASMA REACTOR IGNITION", filed on Oct. 29, 1993, and now abandoned.

BACKGROUND OF THE INVENTION

1. Technical Field:

The invention is related to RF matching networks for RF plasma reactors and in particular to the problem of reacting to rapid changes in the load impedance on the plasma RF source occurring during plasma ignition.

2. Background Art:

Referring to FIG. 1, a conventional plasma reactor for etching or depositing material on a semiconductor substrate 12 inside a vacuum chamber 13 includes electrodes 14, 16 connected between an RF output node 18 and ground. A gas (such as fluorine-containing gas) is introduced into the chamber 13 and is ionized by the RF energy from the electrodes 14, 16 to form a plasma consisting of charged particles 19. The RF output node 18 is connected through an RF impedance matching network 20 to an RF generator 22. The impedance matching network 20 is required to match the output impedance of the RF generator 22 to the input impedance presented by the combination of the electrodes 14, 16 and the plasma 19 (hereinafter referred to as the "plasma impedance"). Without such impedance matching, a significant amount of RF power output by the RF generator 22 does not reach the plasma,19 due to reflection at the point of impedance mismatch, so that control of the RF power applied to the plasma is lost.

Typically, the impedance matching network 20 consists of a load capacitor 24 connected across the RF output node 18 and ground, a series inductor 26 and a tuning capacitor 28 connected in series with the RF output node 18 and,the electrode 16. Such an impedance matching network is available from R.F Power Products, Marlton, N.J. Preferably, the load and tuning capacitors 24, 28 are vacuum variable capacitors of the type sold by ITT Jennings of San Jose, Calif. which can be set to a very precise capacitance value. One advantage of such a vacuum variable capacitor is that it is tuned across its entire capacitance range (e.g., 20 to 1000 picoFarads) with about 20 turns of its control shaft, making it very easy to adjust to a precise capacitance value with great accuracy. A disadvantage is that its capacitance cannot be changed quickly, due to the relatively high number of turns of its control shaft required for a significant change in capacitance.

The vacuum variable capacitor constitutes a pair of electrodes, each constructed as a set of concentric bands. The bands of each electrode are spaced so that they fall between the bands of the other electrode. As the two electrodes are moved closer together (by turning the control shaft), the bands of one electrode pass between the bands of the other, thereby increasing the capacitance. The capacitor is housed in an evacuated air-tight vessel with a vacuum seal around the control shaft. Rapid rotation of the control shaft tends to damage the vacuum seal.

The problem addressed by the present invention is that when the plasma 19 is first being ignited (i.e., during the onset of plasma ignition), the input impedance presented to the matching network 20 behaves as illustrated in the graph of FIG. 2, the magnitude of the plasma input impedance dropping rapidly from 150 ohms to only 20 ohms in a time period between T1 and T2 on the order of microseconds. After time T2, the plasma is in a steady state because ignition is complete, although there may be small variations in the plasma impedance during the steady state. Since a conventional matching network (of the type discussed above) cannot follow such a rapid change, control over applied RF power to the plasma 19 is lost because during that time there is an impedance mismatch between the RF generator 22 and the plasma 19 (i.e., during the onset of plasma ignition prior to reaching the steady state), causing a reflection of an uncontrollable amount of the RF power back toward the RF generator 22.

One solution to this problem might be to rapidly vary the vacuum variable capacitors 24, 28 of the impedance matching network 20. However, this would not be a viable solution because implementing such a fast servo loop would create stability problems. Moreover, the vacuum variable capacitors 24, 28 are susceptible to being damaged by attempting to change their capacitance too rapidly (i.e., in the extremely short time frame illustrated in FIG. 2).

Another solution to this problem (conceived by the inventors herein) might be to electrically switch in supplemental reactive elements (e.g., supplemental capacitors) adding just the right amount of reactance (capacitance) required during ignition from T1 to T2 and then instantly disconnecting them from the circuit at T2. However, such electrical switching would be too noisy and may tend to introduce reliability problems.

Thus, there has seemed to be no practical way of maintaining impedance match during the onset of plasma ignition to avoid loss of control over applied RF power to the plasma.

SUMMARY OF THE DISCLOSURE

An impedance matching network for an RF coupled plasma reactor having RF excitation apparatus receiving RF power through the impedance matching network from an RF generator for producing a plasma in the reactor has at least one capacitor connected to the output of the RF generator having a capacitance value providing a match to an input plasma impedance during a steady state of the plasma, at least a first rapidly tunable capacitor connected in parallel with the one capacitor, the rapidly tunable capacitor having a high capacitance value required to provide impedance matching by the network during the onset of plasma ignition and a lesser capacitance value, and a controller for rapidly switching the rapidly tunable capacitor from the high to the lesser capacitance value upon reaching the plasma steady state.

DETAILED DESCRIPTION OF THE INVENTION

Figure 1:
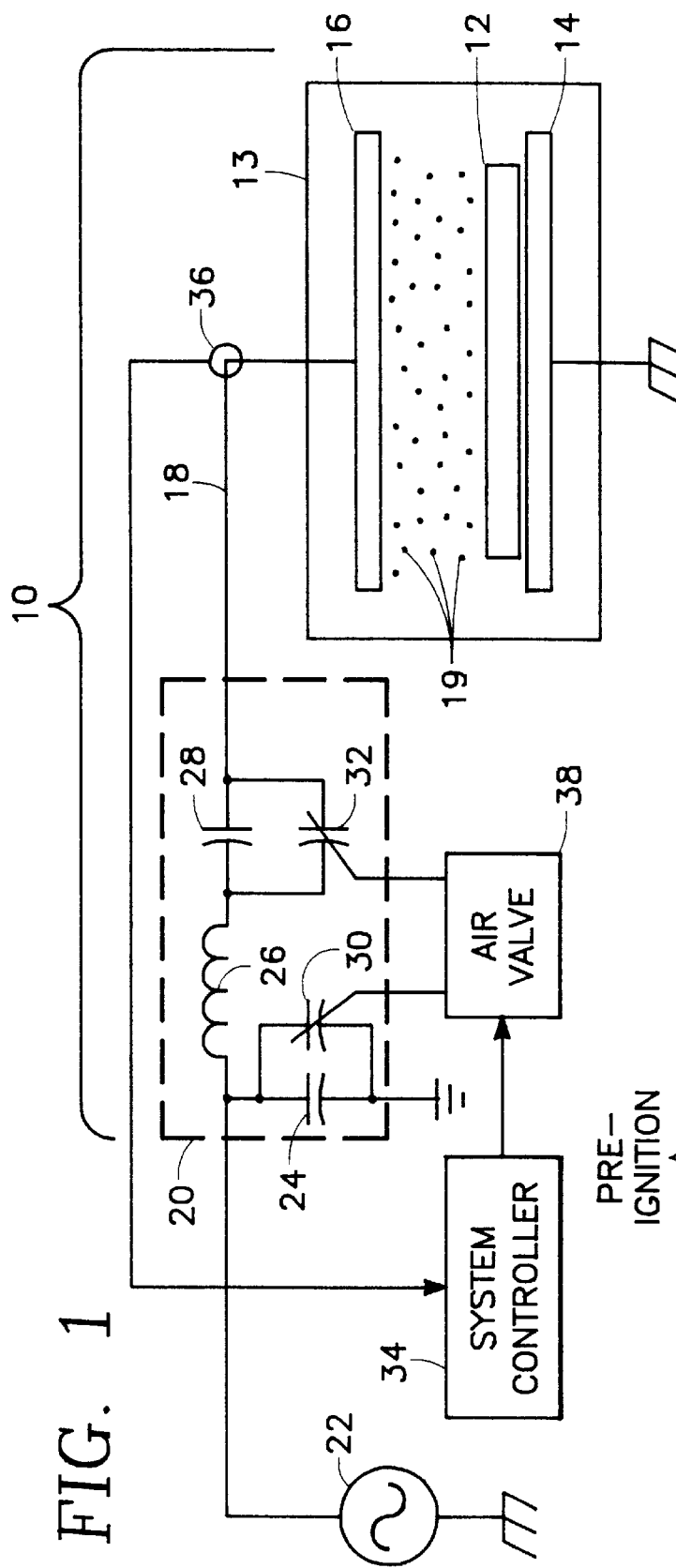
FIG. 1 is a simplified schematic diagram of an RF plasma reactor system incorporating in part an embodiment of the invention.

Referring again to FIG. 1, the invention overcomes the problem of rapid decrease in plasma impedance at the onset of plasma ignition by connecting rapidly tunable capacitors such as air variable capacitors 30, 32 in parallel with the existing tuning and load capacitors 24, 28, respectively, of the impedance matching network 20. The load and tuning capacitors 24, 28 are carefully set at capacitance values which precisely match the plasma impedance during steady state operation. The maximum capacitance of each air variable capacitor 30, 32 is set to a capacitance value so that, when added in parallel to the capacitance of the load and tuning capacitor 24, 28, respectively, the impedance matching network 20 matches the input plasma impedance at the beginning or onset of plasma ignition. The minimum capacitance of each air variable capacitor 30, 32 is set to a negligible capacitance value relative to—i.e., is a fraction (e.g., 5%) of—the capacitance of the load and tuning capacitors 24, 28 respectively. Since the capacitances of the parallel capacitor pairs 24, 30 and 28, 32 are additive, the air variable capacitors 30, 32 have virtually no effect on the impedance matching network 20 when turned to their minimum capacitance values.

The air variable capacitor (e.g., 30, 32) is sold by Cardwell located in Lindenhurst, Long Island, N.Y. and by Oren Elliot located in Edgerton, Ohio, and is adjustable between 20 and 1000 picofarads with only half a turn of its control shaft, and therefore is not particularly suitable to precision capacitance control of the type required during steady state plasma operation. Using a pneumatic rotary actuator (e.g., 50, 52), the air variable capacitor is adjustable from 1000 to 20 picofarads in 0.1 seconds. This type of rapid movement can be performed millions of times with no failure of the air variable capacitor. The capacitor consists of parallel equally spaced interleaved conductive vanes. Half of the vanes form one capacitor electrode and the remaining vanes form the other electrode. The capacitance is varied by rotating a control shaft so as to pass the vanes of one electrode between the vanes of the other electrode, thereby increasing capacitance.

Figure 2:
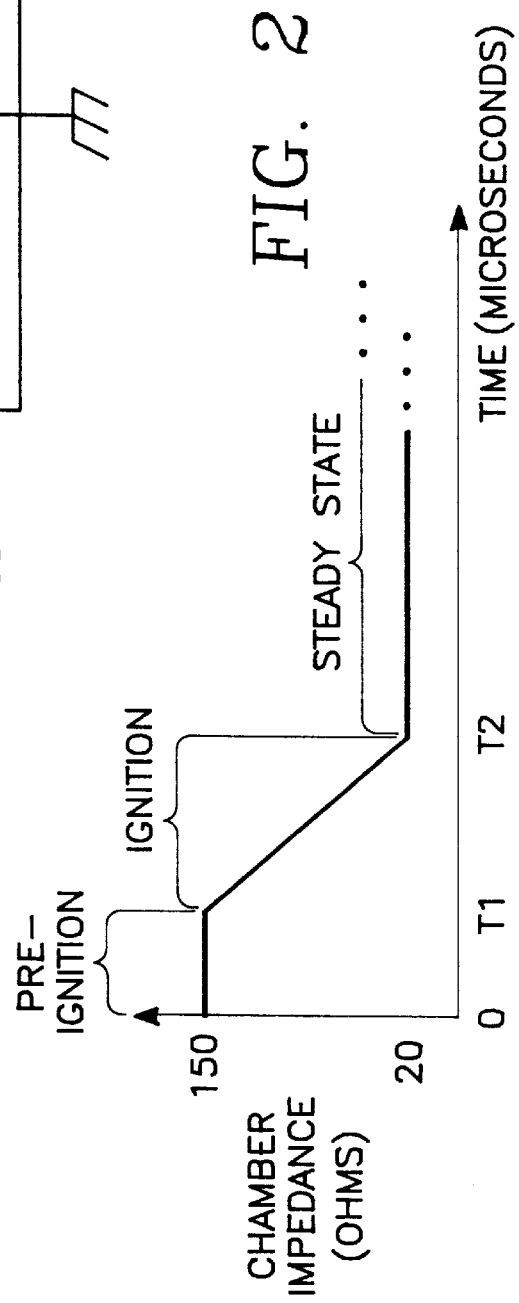
FIG. 2 is a graph of the time dependent behavior of the chamber impedance presented by the plasma and measured across the RF excitation electrodes of the reactor of FIG. 1 during the onset of plasma ignition.

A system controller 34 responsive to a current sensor 36 monitoring the output of the RF generator 22 causes an air valve 38 to rapidly switch the air variable capacitors 30, 32 from their maximum capacitance values to their minimum (negligible) capacitance values immediately (i.e., within 0.1 second) upon complete plasma ignition (indicated by an increased current flow by the current sensor 36). As a result, the impedance matching network 20 more closely follows the time-dependent impedance behavior of the plasma illustrated in the graph of FIG. 2, thereby greatly improving control over applied RF power in the plasma during the onset of plasma ignition. In FIG. 2, the "preignition" period prior to plasma ignition precedes the "ignition" period, which lasts for several microseconds time T1 to time T2, after which is in a "steady state" so that the chamber impedance is constant.

Figure 3:
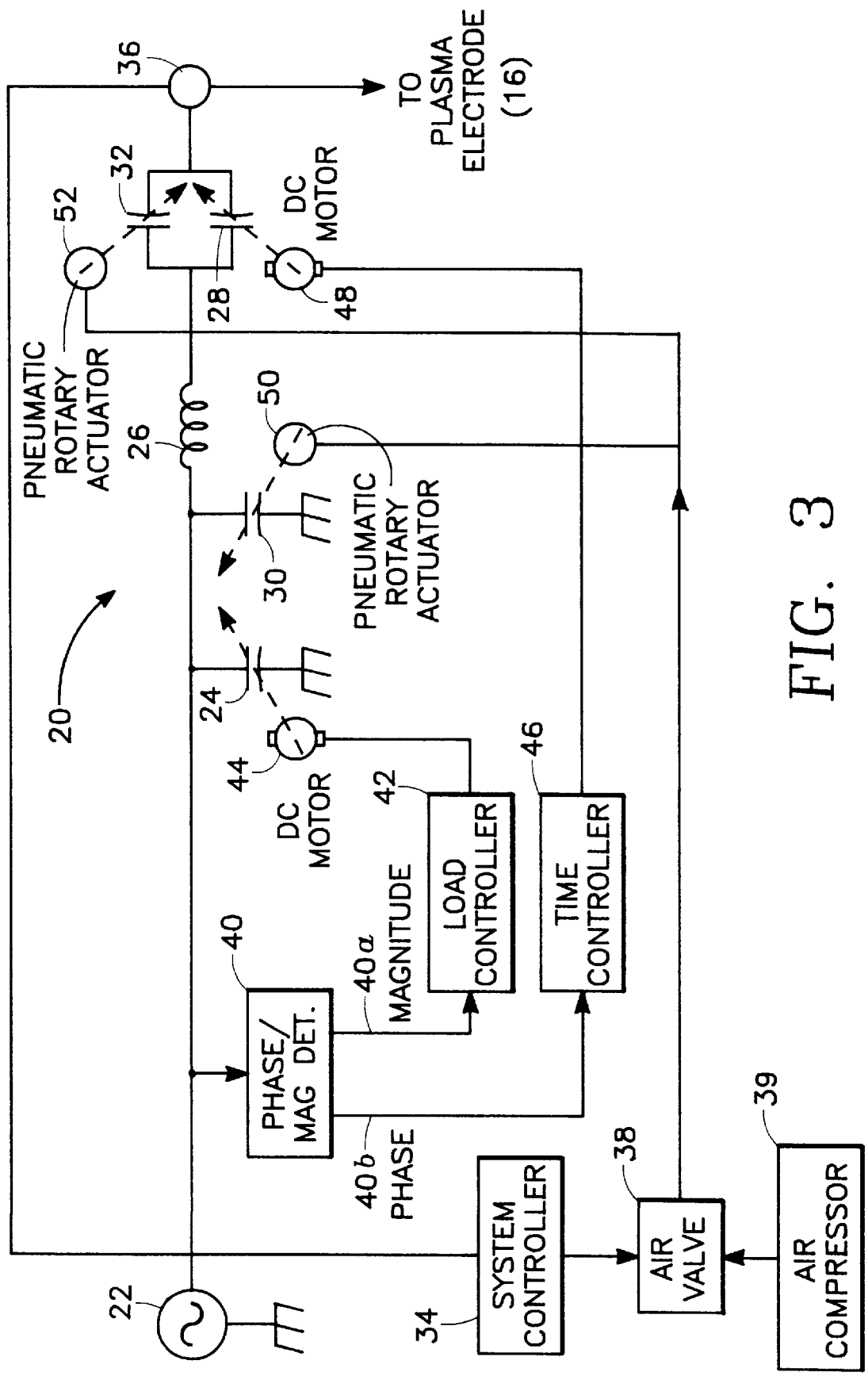
FIG. 3 is a simplified schematic diagram of a preferred embodiment of the invention.

FIG. 3 illustrates how all of the capacitors are controlled. FIG. 3 indicates that the air valve 38, receiving air from an air compressor 39, controls pneumatic rotary actuators 50, 52 connected to the control shafts of the air variable capacitors 30, 32, respectively. The elements of the reactor of FIG. 1 also present in FIG. 3 have the same reference numerals in both FIGS. 1 and 3 and have already been described with reference to FIG. 1.

In FIG. 3, the vacuum variable load and tune capacitors 24, 28 are precisely controlled as follows: A phase-magnitude detector 40 monitors the phase and magnitude relationship between the current and voltage output by the RF generator 22. The magnitude output 40a of the detector 40 outputs a voltage proportional to the ratio between the RF generator voltage and current while the phase output 40b outputs a voltage proportional to the phase angle between the RF generator voltage and current. A load controller 42 responds to the voltage from the magnitude output by commanding a D.C. motor 44 to rotate the control shaft of the load vacuum variable capacitor 24 so that its capacitance follows changes in the impedance magnitude. A time controller 46 responds to the voltage from the phase output 40b by commanding a D.C. motor 48 to rotate the control shaft of the tuning vacuum variable capacitor 28 so that its capacitance follows changes in the phase angle between the RF generator current and voltage. Thus, the impedance of the network 20 will change under control of the phase-magnitude detector 40 to follow fluctuations in the plasma impedance indicated by changes in the magnitude and phase of the impedance measured by the phase-magnitude detector 40. However, since fluctuations in the plasma impedance are relatively slight after achievement of steady state following ignition (in comparison to the rapid decrease in impedance at the onset of plasma ignition shown in FIG. 2), the tuning and load capacitors 24, 28 need not be capable of rapid tuning, and therefore are best implemented as vacuum variable capacitors due to their precision (i.e., large number of turns of their control shaft for a given capacitance change).

Figure 4:
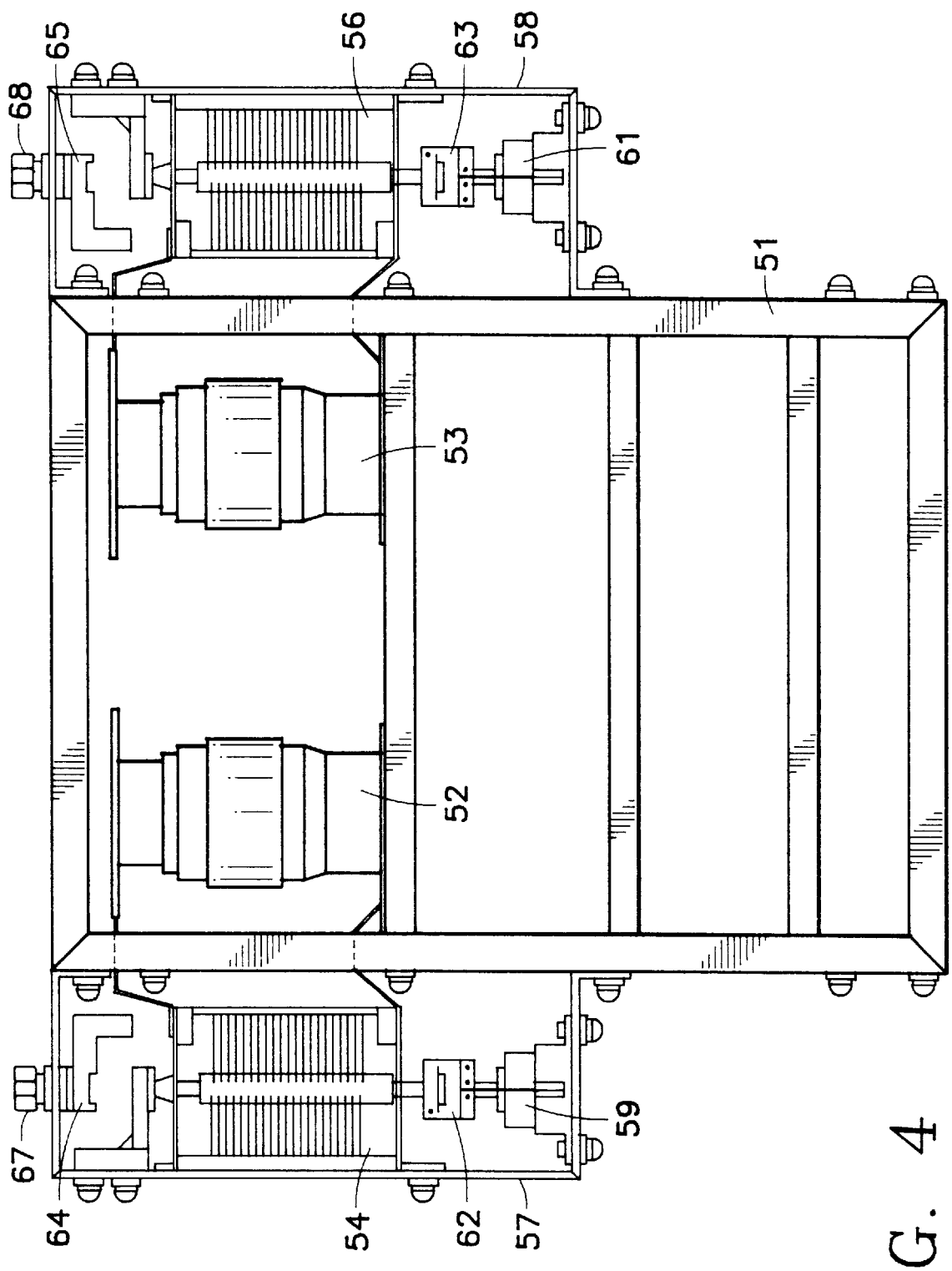
FIG. 4 is an elevational view of a portion of the air variable capacitors in the embodiment of FIG. 3.

FIG. 4 illustrates one implementation of the invention. A frame 51 supports two standard vacuum variable capacitors 52, 53 (which are the capacitors 24, 28 of FIG. 3, respectively). Two air variable capacitors (which are the capacitors 30, 32, respectively of FIG. 3) are mounted via brackets 57, 58 to the exterior of the frame 51 adjacent the vacuum variable capacitors 52, 53. Respective rotary actuators 59, 61 for adjusting each air variable capacitor 54, 56 are connected via an insulated coupling 62, 63, respectively, to the control shaft of the air variable capacitors 54, 56 to provide adjustment. An adjustable mechanical stop 64, 65 for each of the capacitors is provided. The mechanical stops 64, 65 are used to provide a maximum air variable capacitor value which is adjustable, and should correspond to the capacitance required to match the plasma impedance at the very beginning of plasma ignition (corresponding to time T1 of FIG. 2). The mechanical stops 64, 65 may be adjusted by loosening a respective collet 67 or 68 and rotating the air variable capacitor, and then retightening the collet.

In one working example, the vacuum variable load and tuning capacitors 24 and 28, respectively, were each held at 500 picoFarads, the inductor 26 had an inductance providing the matching network 20 with an impedance magnitude of 50 ohms at the frequency of the RF generator 22. The maximum capacitance of each of the air variable capacitors 30, 32 was set to 400 picoFarads and the minimum capacitance of each air variable capacitor 30, 32 was 20 picoFarads.

While FIG. 1 shows the invention implemented with a capacitively coupled RF plasma reactor having parallel RF electrodes 14, 16, it is applicable as well to other types of RF plasma reactors, such as inductively coupled RF plasma reactors having helically coiled RF antennas or the like in the side wall or ceiling or other types of RF plasma reactors.

While the invention has been described in detail by specific reference to preferred embodiments thereof, it is understood that variations and modifications may be made without departing from the true spirit and scope of the invention.

What is claimed is:

1. An impedance matching network for an RF plasma reactor having RF excitation apparatus receiving RF power through said impedance matching network from an RF generator to ignite and maintain a plasma in said reactor, and presenting a plasma impedance to said impedance matching network, said network comprising:

a current path including an input conductor connectable to said RF generator and an output conductor connectable to said RF excitation apparatus;

a common return connection;

at least one vacuum variable capacitor connected between said current path and said common return connection and having a variable capacitance value corresponding to a match to said plasma impedance during a steady state of said plasma;

at least a first air variable capacitor connected in parallel with said at least one vacuum variable capacitor, said first air variable capacitor being switchable between a high capacitance value providing a match to said plasma impedance during an onset of plasma ignition, and a negligible capacitance value with respect to said high capacitance value; and means coupled to said first air variable capacitor for setting said first air variable capacitor to said high capacitance value prior to ignition of said plasma in said reactor and for switching said first air variable capacitor from said high to said negligible capacitance value upon said plasma reaching said steady state.

2. The network of claim 1 wherein said means for switching comprises:

means coupled to said output conductor for sensing whenever said plasma reaches said steady state; and actuator means linked to said first air variable capacitor for controlling said first air variable capacitor in response to said means for sensing.

3. The network of claim 2 wherein said means for sensing comprises a current sensor connected to said output conductor to sense current output.

4. The network of claim 2 wherein said first air variable capacitor is tunable between said high and negligible capacitance values by movement of a mechanical link which is part of said actuator means.

5. The network of claim 4 further comprising a source of compressed air, and wherein said actuator means comprises an air valve governed by said means for sensing and a pneumatic rotor connected to said mechanical link and driven by compressed air from said source of compressed air through said air valve.

6. An impedance matching network for an RF plasma reactor having RF excitation apparatus receiving RF power through said impedance matching network from an RF generator to ignite and maintain a plasma in said reactor, and presenting a plasma impedance to said impedance matching network, said network comprising:

an input conductor connectable to said RF generator;

an output conductor connectable to said RF excitation apparatus;

means coupled to said output conductor for sensing whenever said plasma reaches said steady state;

a common return connection;

at least one capacitor connected in series between said input and output conductors, and having a variable capacitance value corresponding to a match to said plasma impedance during a steady state of said plasma;

at least a first tunable capacitor connected in parallel with said at least one capacitor, said first tunable capacitor being switchable between a high capacitance value providing a match to said plasma impedance during onset of plasma ignition and a negligible capacitance value with respect to said high capacitance value, within a fraction of a second over many repetitions; and means coupled to said first tunable capacitor for setting said first tunable capacitor to said high capacitance value prior to ignition of said plasma in said reactor and for switching said first tunable capacitor from said high to said negligible capacitance value upon said plasma reaching said steady state, said means for switching including actuator means linked to said first tunable capacitor for controlling said first tunable capacitor in response to said means for sensing, said first tunable capacitor tuned by movement of a mechanical link which is part of said actuator means.

7. An impedance matching network for an RF plasma reactor having RF excitation apparatus receiving RF power through said impedance matching network from an RF generator to ignite and maintain a plasma in said reactor, and presenting a plasma impedance to said impedance matching network, said network comprising:

a current path including an input conductor connectable to said RF generator and an output conductor connectable to said RF excitation apparatus;

a common return connection;

at least one capacitor connected between said current path and said common return connection and having a variable capacitance value corresponding to a match to said plasma impedance during a steady state of said plasma;

means coupled to said output conductor for sensing whenever said plasma reaches said steady state;

at least a first tunable capacitor connected in parallel with said at least one capacitor, said first tunable capacitor being switchable between a high capacitance value providing a match to said plasma impedance during onset of plasma ignition and a negligible capacitance value with respect to said high capacitance value, within a fraction of a second over many repetitions; and means coupled to said first tunable capacitor for setting said first tunable capacitor to said high capacitance value prior to ignition of said plasma in said reactor and for switching said first tunable capacitor from said high to said negligible capacitance value upon said plasma reaching said steady state, said means for switching including actuator means linked to said first tunable capacitor for controlling said first tunable capacitor in response to said means for sensing, said first tunable capacitor tuned by movement of a mechanical link which is part of said actuator means.

8. The network of claim 7 wherein said at least one capacitor comprises a load capacitor, said network further comprising:

a series tuning capacitor disposed in said current path and connected in series between said input and output conductors and having a variable capacitance value which, in combination with said load capacitor, corresponds to an impedance match with said plasma impedance during said steady state of said plasma;

a second tunable capacitor connected in parallel with said series tuning capacitor and having a high capacitance value providing an impedance match to said plasma impedance during onset of plasma ignition, and a negligible capacitance value with respect to said high capacitance value of said second tunable capacitor; and wherein said means coupled to said first tunable capacitor for switching controls both said first and second tunable capacitors.

9. The network of claim 8 further comprising:

first means coupled to said load capacitor for precisely adjusting said load capacitor over a limited range and second means coupled to said series tuning capacitor for adjusting said series tuning capacitor over a limited range;

means coupled to said input conductor for sensing a magnitude and phase of an output of said RF generator and for transmitting a magnitude signal and a phase signal proportional thereto; and means connected to said first and second means for adjusting for controlling said first means for adjusting in accordance with said magnitude signal and for controlling said second means for adjusting in accordance with said phase signal.

10. The network of claim 9 wherein each of said first and second means for adjusting comprises a respective electric motor.

11. An impedance matching network for matching the RF impedance of an RF generator for igniting and maintaining a plasma within a plasma reactor with a plasma impedance of an RF input of the plasma reactor, comprising:

a current path including an input conductor connectable to said RF generator and an output conductor connectable to said RF input;

a common return connection;

at least one vacuum variable capacitor connected between said current path and said common return connection, said at least one vacuum variable capacitor being variable within a first capacitance range at a first tuning rate; and an air variable capacitor electrically disposed in parallel to said at least one vacuum variable capacitor and being varied upon an ignition of said plasma within said plasma reactor, said air variable capacitor being varied within a second capacitance range at a second tuning rate, said second tuning rate being substantially greater than said first tuning rate such that said impedance matching network is capable of maintaining impedance matching between onset of the ignition of said plasma and reaching of a steady state condition by said plasma.

12. The network of claim 11, wherein said second capacitance range is substantially greater than said first capacitance range.

13. The network of claim 12, further comprising a current sensor serially connected to said output conductor, wherein said air variable capacitor changes from a first predetermined capacitance to a second predetermined capacitance in response to an output of said current sensor exceeding a predetermined value.

14. An impedance matching network for an RF plasma reactor having RF excitation apparatus receiving RF power through said impedance matching network from an RF generator to ignite and maintain a plasma in said reactor, and presenting a plasma impedance to said impedance matching network, said network comprising:

a current path including an input conductor connectable to said RF generator and an output conductor connectable to said RF excitation apparatus;

a common return connection;

at least one capacitor connected between said current path and said common return connection and having a variable capacitance value corresponding to a match to said plasma impedance during a steady state of said plasma;

means coupled to said output conductor for sensing whenever said plasma reaches said steady state;

at least a first tunable capacitor connected in parallel with said at least one capacitor, said first tunable capacitor being switchable between a high capacitance value providing a match to said plasma impedance during onset of plasma ignition, and a negligible capacitance value with respect to said high capacitance value;

a source of compressed air; and means coupled to said first tunable capacitor for setting said first tunable capacitor to said high capacitance value prior to ignition of said plasma in said reactor and for switching said first tunable capacitor from said high to said negligible capacitance value upon said plasma reaching said steady state, wherein said means for switching includes actuator means linked to said first tunable capacitor for controlling said first tunable capacitor in response to said means for sensing, said actuator means comprising an air valve connected to said source of compressed air and governed by said means for sensing, a pneumatic rotor driven by compressed air from said air valve, and a mechanical link connected to said rotor so that said first tunable capacitor is tuned by movement of said mechanical link.

15. The network of claim 14 wherein said at least one capacitor comprises a vacuum variable capacitor and said first tunable capacitor comprises an air variable capacitor.

16. The network of claim 14 wherein said first tunable capacitor is of the type which is tunable from said high to said negligible capacitance value within a fraction of a second over many repetitions.

17. The network of claim 16 wherein said first tunable capacitor comprises an air variable capacitor and wherein said mechanical link comprises a rotatable control shaft which moves said air variable capacitor between said high and negligible capacitance values with not more than one complete rotation of said rotatable control shaft.

18. An impedance matching network for an RF plasma reactor having RF excitation apparatus receiving RF power through said impedance matching network from an RF generator to ignite and maintain a plasma in said reactor, and presenting a plasma impedance to said impedance matching network, said network comprising:

an input conductor connectable to said RF generator;

an output conductor connectable to said RF excitation apparatus;

a common return connection;

at least one vacuum variable capacitor connected in series between said input and output conductors, and having a variable capacitance value corresponding to a match to said plasma impedance during a steady state of said plasma;

at least a first air variable capacitor connected in parallel with said at least one vacuum variable capacitor, said first air variable capacitor being switchable between a high capacitance value providing a match to said plasma impedance during an onset of plasma ignition, and a negligible capacitance value with respect to said high capacitance value; and means coupled to said first air variable capacitor for setting said first air variable capacitor to said high capacitance value prior to ignition of said plasma in said reactor and for switching said first air variable capacitor from said high to said negligible capacitance value upon said plasma reaching said steady state.

19. The network of claim 18 wherein said means for switching comprises:

means coupled to said output conductor for sensing whenever said plasma reaches said steady state;

actuator means linked to said first air variable capacitor for controlling said first air variable capacitor in response to said means for sensing.

20. The network of claim 19 wherein said means for sensing comprises a current sensor connected to said output conductor to sense current output.

21. The network of claim 19 wherein said first air variable capacitor is tunable between said high and negligible capacitance values by movement of a mechanical link which is part of said actuator means.

22. The network of claim 21 further comprising a source of compressed air, and wherein said actuator means comprises an air valve governed by said means for sensing and a pneumatic rotor connected to said mechanical link and driven by compressed air from said source of compressed air through said air valve.

23. An impedance matching network for an RF plasma reactor having RF excitation apparatus receiving RF power through said impedance matching network from an RF generator to ignite and maintain a plasma in said reactor, and presenting a plasma impedance to said impedance matching network, said network comprising:

an input conductor connectable to said RF generator;

an output conductor connectable to said RF excitation apparatus;

a common return connection;

at least one capacitor connected in series between said input and output conductors, and having a variable capacitance value corresponding to a match to said plasma impedance during a steady state of said plasma;

means coupled to said output conductor for sensing whenever said plasma reaches said steady state;

at least a first tunable capacitor connected in parallel with said at least one capacitor, said first tunable capacitor being switchable between a high capacitance value providing a match to said plasma impedance during onset of plasma ignition, and a negligible capacitance value with respect to said high capacitance value;

a source of compressed air; and means coupled to said first tunable capacitor for setting said first tunable capacitor to said high capacitance value prior to ignition of said plasma in said reactor and for switching said first tunable capacitor from said high to said negligible capacitance value upon said plasma reaching said steady state, wherein said means for switching includes actuator means linked to said first tunable capacitor for controlling said first tunable capacitor in response to said means for sensing, said actuator means comprising an air valve connected to said source of compressed air and governed by said means for sensing, a pneumatic rotor driven by compressed air from said air valve, and a mechanical link connected to said rotor so that said first tunable capacitor is tuned by movement of said mechanical link.

24. The network of claim 23 wherein said at least one capacitor comprises a vacuum variable capacitor and said first tunable capacitor comprises an air variable capacitor.

25. The network of claim 23 wherein said first tunable capacitor is of the type which is tunable from said high to said negligible capacitance value within a fraction of a second over many repetitions.

26. The network of claim 25 wherein said first tunable capacitor comprises an air variable capacitor and wherein said mechanical link comprises a rotatable control shaft which moves said air variable capacitor between said high and negligible capacitance values with not more than one complete rotation of said rotatable control shaft.

27. An impedance matching network for matching the RF impedance of an RF generator for igniting and maintaining a plasma within a plasma reactor with a plasma impedance of an RF input of the plasma reactor, comprising:

an input conductor connectable to said RF generator;

an output conductor connectable to said RF input;

at least one vacuum variable capacitor connected in series between said input and output conductors, said at least one vacuum variable capacitor being variable within a first capacitance range at a first tuning rate; and an air variable capacitor electrically disposed in parallel to said at least one vacuum variable capacitor and being varied upon an ignition of said plasma within said plasma reactor, said air variable capacitor being variable within a second capacitance range at a second tuning rate, said second tuning rate being substantially greater than said first tuning rate such that said impedance matching network is capable of maintaining impedance matching between onset of the ignition of said plasma and reaching of a steady state condition by said plasma.

28. The network of claim 27, wherein said second capacitance range is substantially greater than said first capacitance range.

29. The network of claim 28, further comprising a current sensor serially connected to said output conductor, wherein said air variable capacitor changes from a first predetermined capacitance to a second predetermined capacitance in response to an output of said current sensor exceeding a predetermined value.

* * * * *